United States Patent

Shiraishi et al.

[11] Patent Number: 5,552,856
[45] Date of Patent: Sep. 3, 1996

[54] PROJECTION EXPOSURE APPARATUS

[75] Inventors: Naomasa Shiraishi, Kawasaki; Shigeru Hirukawa, Kashiwa, both of Japan

[73] Assignee: Nikon Corporation, Tokyo, Japan

[21] Appl. No.: 563,907

[22] Filed: Nov. 22, 1995

Related U.S. Application Data

[63] Continuation of Ser. No. 264,253, Jun. 22, 1994, abandoned, which is a continuation of Ser. No. 076429, Jun. 14, 1993, abandoned.

[51] Int. Cl.⁶ ............................................ G03B 27/42
[52] U.S. Cl. .............................. 355/53; 355/67; 355/71
[58] Field of Search ............................ 355/53, 67, 71, 355/75

[56] References Cited

U.S. PATENT DOCUMENTS

| | | | |
|---|---|---|---|
| 4,869,999 | 9/1989 | Fukuda et al. | 430/311 |
| 4,918,583 | 4/1990 | Kudo et al. | 362/268 |
| 5,144,362 | 9/1992 | Kamon et al. | 355/53 |
| 5,203,401 | 4/1993 | Hamburgen et al. | 165/80.4 |
| 5,208,629 | 5/1993 | Matsuo et al. | 355/53 |
| 5,220,171 | 6/1993 | Hara et al. | 250/443.1 |
| 5,253,040 | 10/1993 | Kamon et al. | 355/53 |
| 5,264,898 | 11/1993 | Kamon et al. | 355/53 |
| 5,286,963 | 2/1994 | Torigoe | 355/53 |
| 5,287,142 | 2/1994 | Kamon | 355/53 |
| 5,311,249 | 5/1994 | Kamon et al. | 355/71 |
| 5,329,333 | 7/1994 | Noguchi et al. | 355/53 |
| 5,335,044 | 8/1994 | Shiraishi | 355/53 |
| 5,345,292 | 9/1994 | Shiozawa et al. | 355/67 |
| 5,348,837 | 9/1994 | Fukuda et al. | 355/53 |

FOREIGN PATENT DOCUMENTS 2-166717  6/1990  Japan .

*Primary Examiner*—Michael L. Gellner
*Assistant Examiner*—D. P. Malley
*Attorney, Agent, or Firm*—Shapiro and Shapiro

[57] ABSTRACT

A projection exposure apparatus comprising:
  an illumination, optical system for irradiating a mask with illumination light;
  a projection optical system for projecting an image of a pattern formed on the mask onto a substrate;
  an optical member for defining a light quantity distribution of the illumination light on a Fourier transform plane to the pattern on the mask in the illumination optical system or on a plane in the vicinity thereof such that the illumination light is intensified in a first region inside a substantial circle of radius $r_1$ with the center on the optical axis of the illumination optical system and in a second region formed as a substantially annular zone bordered by a substantial circle of radius $r_2$ and a substantial circle of radius $r_3$ (where $r_1 \leq r_2 < r_3$) with centers thereof on the optical axis, and such that a light quantity in the first region is made approximately twice or more times a light quantity in the second region; and
  a spatial filter having an annular transparent portion and disposed on a Fourier transform plane to the pattern on the mask in the projection optical system or on a plane in the vicinity thereof.

22 Claims, 5 Drawing Sheets

PROJECTION EXPOSURE APPARATUS

This a continuation of application Ser. No. 08/264,253 filed Jun. 22, 1994, which is a continuation of application Ser. No. 08/076,429 filed Jun. 14, 1993, both now abandoned.

BACKGROUND OF THE INVENTION

1. Field of the Invention

The present invention relates to a projection exposure apparatus used in replication of circuit pattern for semiconductor elements or the like. More particularly, the invention relates to a projection exposure apparatus suitable for replication of a hole pattern.

2. Related Background Art

An example of the conventional projection exposure apparatus of this type is proposed for example in Japanese Laid-open Patent Application No. 2-166717, in which an illumination optical system is arranged to have an illumination light quantity distribution of annular zone on a pupil plane thereof or in which a spatial filter having an annular transparent portion is provided in the vicinity of a pupil plane of a projection optical system. Simply illustrated herein by FIGS. 8A and 8B and FIGS. 9A and 9B is the effect of a spatial filter having the annular transparent portion near the pupil plane (aperture plane) of projection exposure apparatus.

FIG. 8A is a schematic drawing of a projection optical system having no spatial filter on the pupil plane, in which diffracted light from hole pattern 10 formed on photomask 9 exhibits a light quantity distribution like L82 on the pupil plane 12a of projection optical system 11. An image of hole pattern 10 produced on wafer 13 is expressed by a square of Fourier transform of amplitude distribution of diffracted light L82. Accordingly, if a diameter of hole pattern 10 is within the resolution limit of projection optical system, the light quantity distribution L84 shown in FIG. 8B will be a light quantity distribution on wafer 13. This light quantity distribution L84 is a square of so-called Bessel function of first kind, in which a distance α from a peak to a dark point in light quantity is $1.22 \times \lambda/(2 \times N.A)$ (where $\lambda$ is an exposure wavelength and N.A a numerical aperture of projection optical system).

FIG. 9A is a schematic drawing of an optical system in which a spatial filter 12 having an annular transparent portion is provided on the pupil plane of projection optical system. In this arrangement an outer diameter of the annular zone is equal to a diameter of the pupil. FIG. 9B shows an image (light quantity distribution) of fine hole pattern 10 on wafer 13 of FIG. 9A. The provision of spatial filter 12 of FIG. 9A makes shorter the distance between the image peak and the dark point, that is, decreases the spread of the distribution of image. This is well known as apodization. The depth of focus is increased at the same time.

There is also proposed an exposure apparatus (for example in U.S. Pat. No. 4,869,999), in which during exposure a wafer to be exposed is moved along the optical axis of projection optical system to carry out multiple exposures at a plurality of locations, whereby the practical depth of focus is increased, especially for a hole pattern. Further, Applicant filed a U.S. patent application Ser. No. 986,639 (Dec. 7, 1992) disclosing an apparatus for performing exposure while a wafer is continuously moved along the optical axis during exposure.

The conventional apparatus, however, had a practical minimum pattern size of $0.7 \lambda/N.A$ (where $\lambda$ is an exposure wavelength and N.A a numerical aperture of projection optical system) because of the diffraction of light and the depth of focus. This minimum pattern size is not improved in the apparatus having the illumination light quantity distribution of annular zone on the pupil plane in illumination optical system.

Although it is possible to lower the minimum pattern size in the apparatus having a spatial filter with annular transparent portion on the pupil plane of projection optical system, a problem is that the linearity is degraded between the pattern size on the photomask and the pattern size (light quantity) projected on the wafer. The reason is as follows.

FIG. 4 to FIG. 7 show an example of a projection optical system having an annular transparent portion on the pupil plane similarly as in FIG. 9A. In FIG. 4 and FIG. 6 a hole pattern 10 on photomask 9 is sufficiently small, so that a spreading angle of diffracted light L41, L61 by the hole pattern 10 is large. In FIG. 5 and FIG. 7 a hole pattern 10 on photomask 9 is sufficiently large, so that a spreading angle of diffracted light L51, L71 by the hole pattern 10 is small. If a diameter (or width) of hole pattern is d, the spread of diffracted light is given by approximately $\pm \lambda/d$ [rad]. FIG. 4 and FIG. 5 shows an example in which a mask 9 is illuminated with illumination light (L40, L50) from an illumination system with small σ value (which represents a relative size of light source image to pupil of the projection optical system, normally $0<\sigma\leq 1$). The diffracted light L41, L51 by hole pattern 10 spreads at a spreading angle according to the size of hole pattern 10. An intensity distribution of diffracted light is L42 or L52 on the spatial filter 12 disposed on the pupil of projection optical system 11. As seen from the distributions, an image of small hole pattern can be projected onto wafer 13 even though dark, while an image of large hole pattern cannot be projected onto wafer 13 because most of diffracted light is shielded by the spatial filter 12. It is thus seen that the arrangement in which the spatial filter having the annular transparent portion is provided on the pupil plane of projection optical system 11 is suitable for replication of a fine hole pattern but not for replication of a large hole pattern together with fine hole pattern.

FIG. 6 and FIG. 7 show an example in which a mask 9 is illuminated with illumination light (L60, L70) obtained from an annular image of a light source formed on a pupil plane in an illumination optical system. If the hole pattern is large as shown in FIG. 7, an intensity distribution L72 of diffracted light on the pupil plane of projection lens 11 is approximately coincident with an annular aperture of spatial filter 12, so that an image of a large hole pattern is replicated on wafer 13.

In contrast, if the hole pattern is small as shown in FIG. 6, the diffracted light presents an intensity distribution L62 greatly broadened on the pupil plane of projection lens 11, so that a light quantity passing through the annular aperture of spatial filter 12 is extremely small and a numerical aperture of a beam reaching the wafer 13 is also small. Therefore, replicated on wafer 13 is an image unfocused (spread) and very dark as compared with the pattern originally desired to be projected. This is shown in FIGS. 10A and 10B. In FIG. 10A, L100 is uniform illumination light, L102 an intensity distribution on pupil plane, and L103 a beam which contributes to image formation on wafer 13. In FIG. 10B, L104 represents an intensity distribution of the image.

Even if the illumination satisfies conditions for the both patterns, that is, even if the illumination is arranged to have a σ value close to 1, the problem remains that an image of fine hole pattern is very dark (low in intensity) while an image of large hole pattern is bright (high in intensity). If with coating of positive photoresist on wafer 13 an exposure amount is determined to suit the large hole pattern, only a large hole pattern is formed but no small hole pattern is formed because of insufficient light quantity. If the exposure amount is increased to suit the small hole pattern, the diameter (width) of the large pattern further increases with increase of light quantity.

The apparatus in which the wafer is moved along the optical axis during exposure for multiple exposure of the same pattern at a plurality of locations is effective especially in increasing the depth of focus of a hole pattern but theoretically ineffective in making the minimum pattern size smaller, that is, in enhancing the resolution.

SUMMARY OF THE INVENTION

It is an object of the present invention to realize a projection exposure apparatus high in resolution and deep in depth of focus especially in replication of a hole pattern.

A projection exposure apparatus according to the present invention comprises an optical member for adjusting a light quantity distribution of illumination light on or near a pupil plane of an illumination optical system such that the distribution is intensified in a substantially circular first region of radius $r_1$ with the center on the optical axis and in a second region formed as an annular zone between a substantial circle of radius $r_2$ and a substantial circle of radius $r_3$ (where $r_1 < r_2 < r_3$), in which by the optical member a light quantity in the first region is adjusted to be approximately twice or more times that in the second region. At the same time, a spatial filter having a removable or interchangeable transparent portion with an annular zone is provided on or near a pupil plane of a projection optical system.

In the present invention, a distribution of illumination light quantity near the pupil plane of the illumination optical system is expressed as a sum of light quantities obtained when the illumination system with smaller σ value (the first substantially circular region of radius $r_1$) and the illumination system of the annular zone (the second region forming the annular zone between radius $r_2$ and radius $r_3$) are simultaneously used. The quantity of illumination light from the annular illumination system must be not more than a half of that of illumination light from the illumination system with smaller σ value. In this arrangement, an image of a fine hole pattern is formed on the wafer by the illumination light from the substantially circular portion of radius $r_1$, which is equivalent to illumination light from illumination system with small σ value, while an image of a large hole pattern is formed on the wafer by illumination light from the annular zone between the radii $r_2$ and $r_3$, which is equivalent to illumination from annular illumination system.

In addition, the quantity of light from the substantial circle of radius $r_1$ is approximately twice or more times light quantity from the annular zone between the radii $r_2$ and $r_3$, whereby the difference of light quantity between fine pattern and large pattern, which was a problem in the conventional exposure apparatus having σ value close to 1, is settled. Also, the present invention keeps the same effect as described above, i.e., the improved resolution and the increased depth of focus by the annular spatial filter provided on the pupil plane of projection optical system.

DESCRIPTION OF THE PREFERRED EMBODIMENTS

Figure 1:
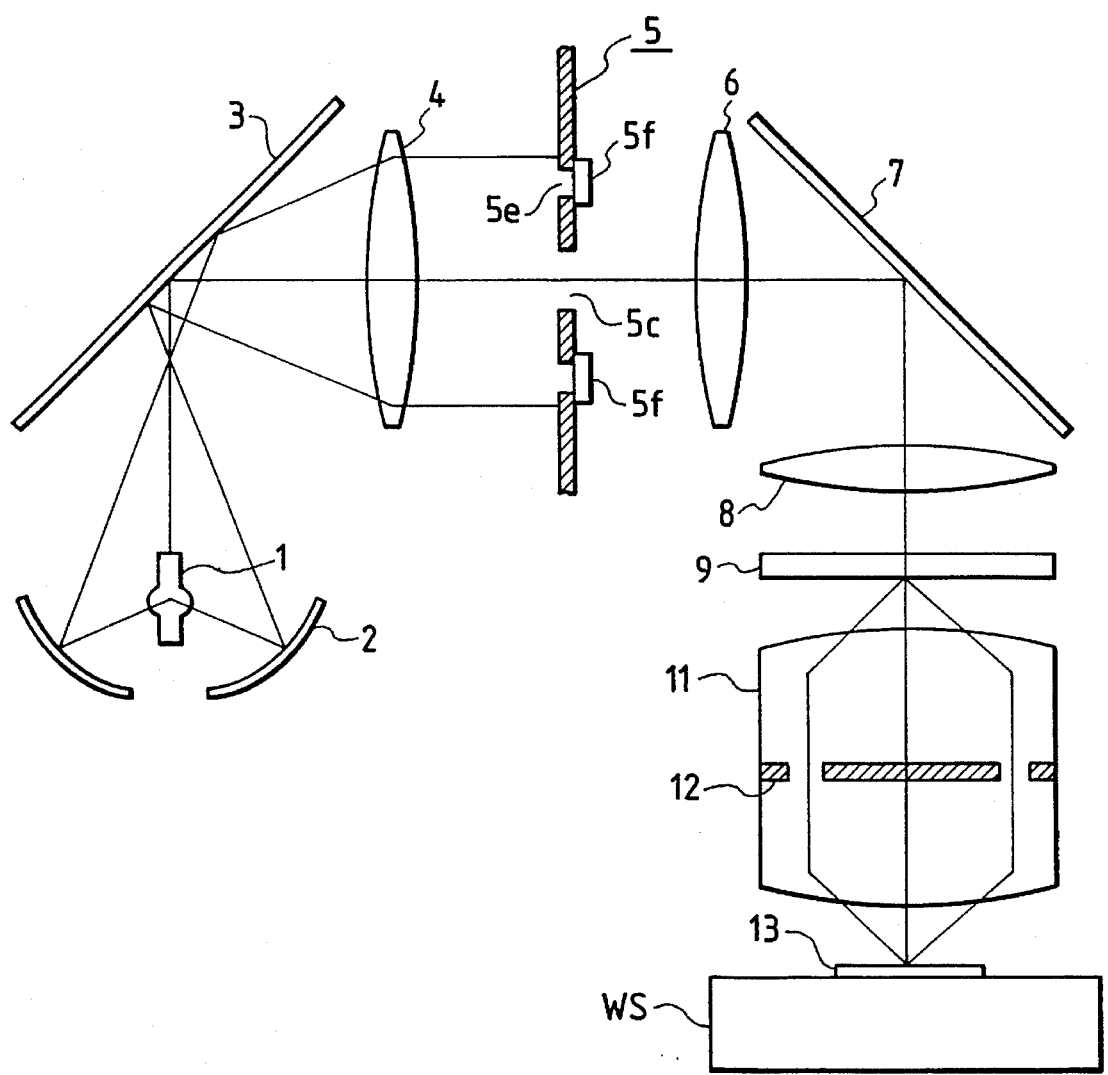
FIG. 1 is a drawing to show the structure of a projection exposure apparatus in an embodiment of the present invention.

FIG. 1 is a schematic drawing to show the structure of a projection exposure apparatus in the embodiment of the present invention. Illumination light emitted from a mercury lamp 1 is reflected by an elliptic mirror 2 and a mirror 3, and then enters a relay lens 4. The illumination light passing through the relay lens 4 is partially shielded by a spatial filter 5 (optical member) provided on or in the vicinity of a Fourier transform plane to a pattern on photomask 9 in illumination optical system 4–8.

Figure 2:
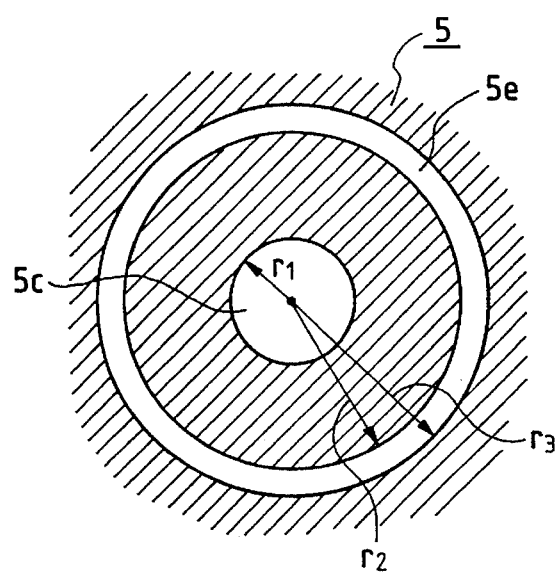
FIG. 2 is a plan view to show a shape of a spatial filter disposed in the illumination optical system.

FIG. 2 shows the spatial filter 5 as seen along the optical axis. A transparent portion is defined in a circle 5c from the center O (a point through which the optical axis passes) and in an annular zone 5e between radius $r_2$ and radius $r_3$ with the center at O, while the remaining portion is a light shielding portion (hatched portion). In this arrangement a ratio of area between the two portions is determined such that a quantity of transmitted light by the center circle 5c is approximately twice or more times a quantity of transmitted light by the annular zone 5e. Alternatively, a light-reducing member (ND filter or the like) 5f may be provided on the annular zone 5e, as shown in FIG. 1, to reduce the quantity of transmitted light by the annular zone 5e. The shielding portion in spatial filter 5 may have a transmittance of not more than approximately a half of the transmittance of the annular zone 5e including the light reducing member 5f.

The illumination optical system may have a fly eye type integrator (fly eye lens) disposed such that an exit plane thereof is nearly coincident with the aforementioned Fourier transform plane, as disclosed for example in U.S. Ser. No. 780,850 (filed Oct. 23, 1991) or in U.S. Pat. No. 4,918,583. Accordingly, the spatial filter 5 is disposed in the vicinity of the exit plane of the fly eye lens, or on a conjugate plane thereof. Alternatively, the spatial filter 5 may be located near the entrance plane of the fly eye lens (a plane conjugate with a pattern on mask 9). If the illumination optical system has a plurality of fly eye lenses arranged in series, the spatial filter 5 may be disposed in the vicinity of the entrance plane or exit plane of any fly eye lens. It is, however, preferable that the spatial filter 5 is located in the vicinity of an exit plane of the fly eye lens closest to the reticle, considering the illumination uniformity on the reticle. If the illumination optical system has the fly eye lens, a contour of the circular transparent portion 5c or the annular transparent portion 5e in spatial filter 5 may be preferably defined to match the arrangement of plural lens elements constituting the fly eye lens.

Further, the spatial filter 5 may be composed of a spatial filter having a circular transparent portion 5c and a spatial filter having an annular transparent portion 5e. The two filters do not always have to be located in the same plane in the illumination optical system, but may be disposed on different planes in the illumination optical system as to maintain the conjugate relation. In another modification the two spatial filters may be separately disposed, one on the entrance plane of a fly eye lens and the other on the exit plane thereof.

In order to decrease a loss in light quantity in the filter 5, the aberration of relay an 4 may be corrected or an optical member such as an optical fiber may be provided so that the intensity of illumination light entering the circular transparent portion 5c and the annular transparent portion 5e in spatial filter 5 is higher than that of illumination light entering the other portion. In case that the intensity of illumination light entering the circular transparent portion 5c is approximately twice or more times the intensity of illumination light entering the annular transparent portion 5e in this arrangement, the light-reducing member 5f may be eliminated.

The illumination light passing through the spatial filter 5 is guided by condenser lenses 6, 8 and a mirror 7 to illuminate photomask 9. Light passing through the photomask 9 (diffracted light) is focused on wafer 13 by the projection optical system 11 which is single-telecentric or double-telecentric, so that the pattern on photomask 9 causes the resist coated on wafer 13 to be exposed to light. The wafer 13 is mounted on a wafer stage WS, with suitable drive to constitute a moving device (relative moving means), movable in the direction of the optical axis of projection optical system 11.

A spatial filter 12 (optical filter) having an annular transparent portion about a substantially circular light sheilding portion of a radius ra is disposed on the pupil plane (at aperture stop) of projection optical system 11. The position of spatial filter 12 is conjugate with the spatial filter 5 in the illumination optical system. Accordingly, the projection optical system 11 performs exposure of the wafer 13 by the Köhler illumination method.

Figure 3:
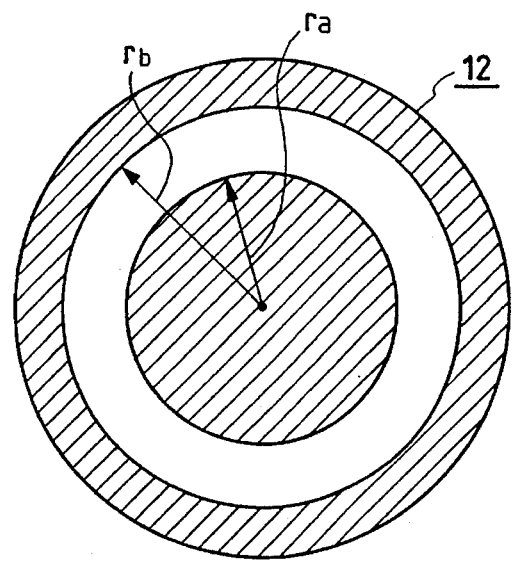
FIG. 3 is a plan view to show a shape of a spatial filter disposed in the projection optical system.
Figure 4:
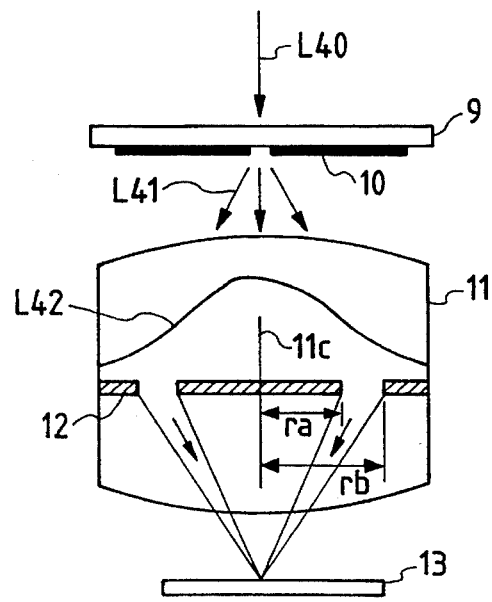
FIG. 4, FIG. 5, FIG. 6 and FIG. 7 are drawings to show exposure conditions with a change of incident condition of illumination light and with a change of pattern size on a reticle (mask) when a spatial filter is disposed in a projection optical system.
Figure 5:
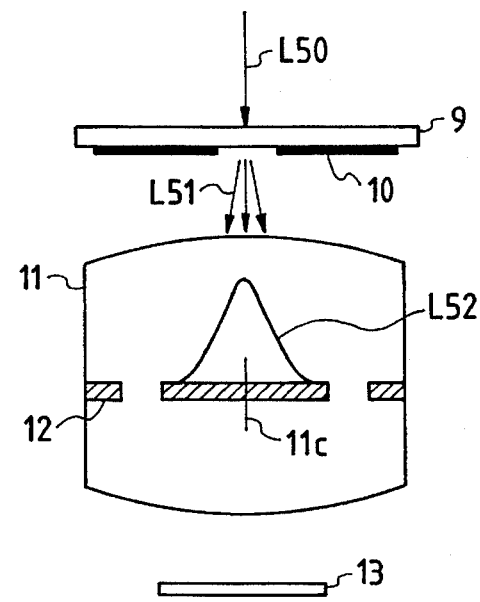
Figure 6:
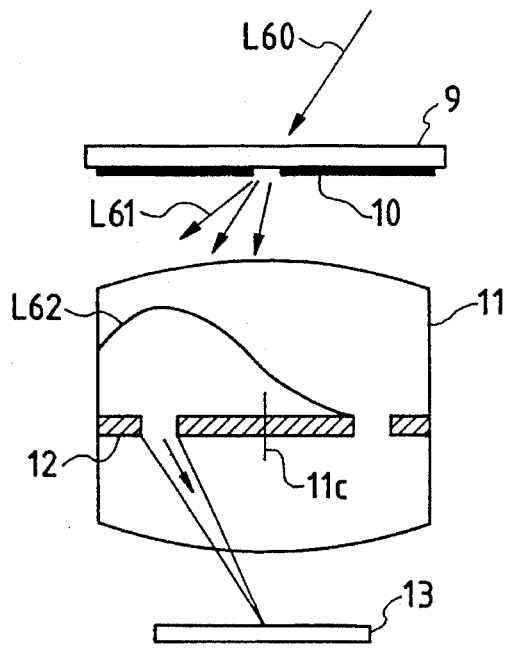
Figure 7:
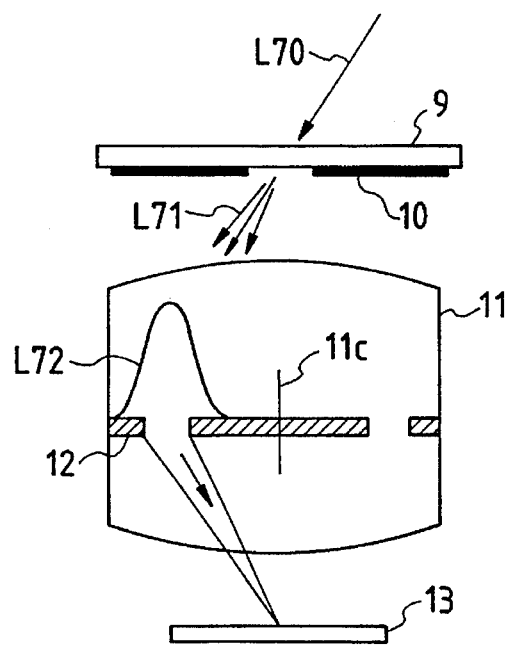
Figure 8A:
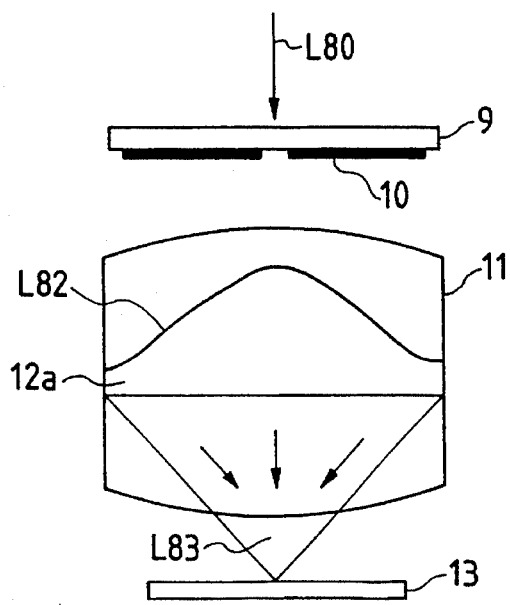
FIGS. 8A and 8B, FIGS. 9A and 9B, and FIGS. 10A and 10B are drawings to show projection exposure conditions in the conventional procedure.
Figure 8B:
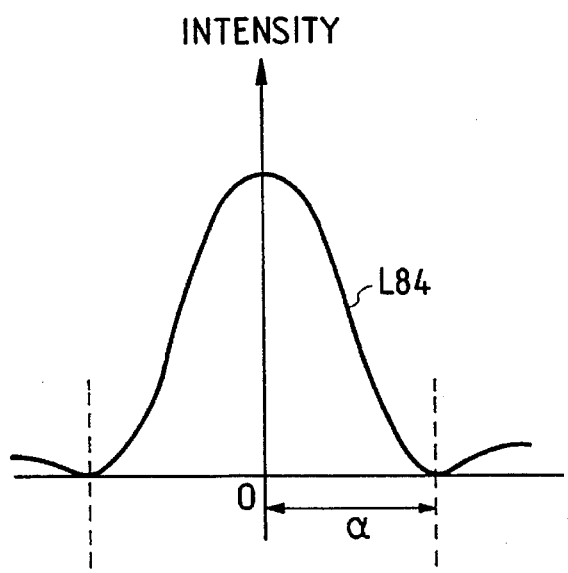
Figure 9A:
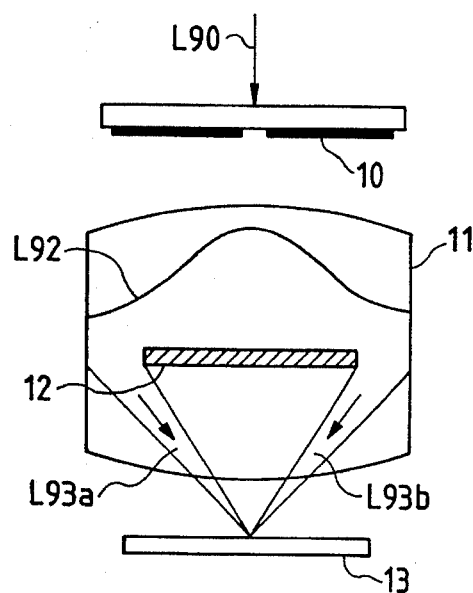
Figure 9B:
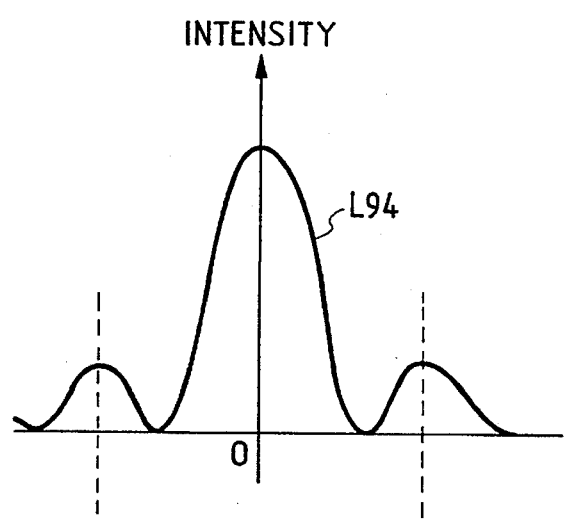
Figure 10A:
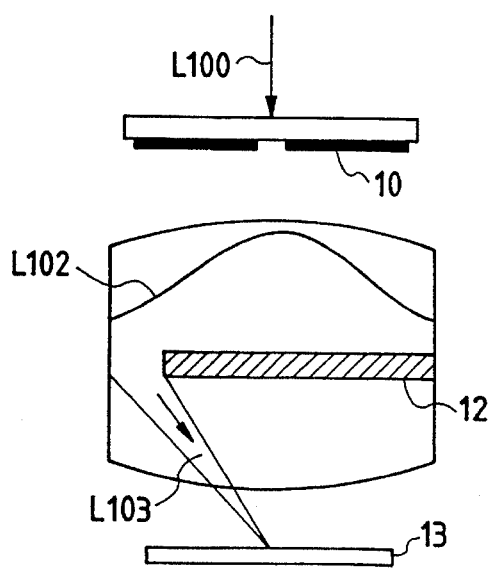
Figure 10B:
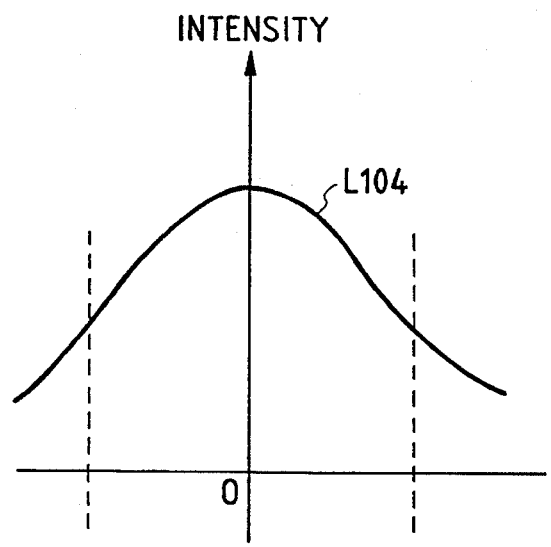

FIG. 3 shows the annular spatial filter 12 as seen along the optical axis. An inner radius $r_a$ and an outer radius $r_b$ of an annular transparent portion are determined depending upon the minimum size of hole pattern replicated onto wafer 13. It is preferable that the radius rb increases with decrease of hole pattern diameter and that the radius $r_b$ decreases with increase of hole pattern diameter. The radius $r_a$ is set to about 0.5–0.8 times the radius $r_b$. If the radius $r_a$ is not more than 0.5 times the radius $r_b$, the effect of the resolution improvement of hole pattern and the focal depth increase would be reduced. On the other hand, if the radius $r_a$ is not less than 0.8 times the radius $r_b$, the diffraction increases subpeaks around the original hole pattern to degrade the image quality of hole pattern. The radius $r_b$ can be arranged to coincide with the radius of the pupil plane of projection optical system 11.

The pupil plane in the illumination optical system is in an image forming relation with the pupil plane in the projection optical system. If the imaging magnification is M, the inner radius $r_2$ and the outer radius $r_3$ of the annular transparent portion 5e in spatial filter 5 on the pupil plane of the illumination optical system may be preferably set approximately to values obtained from the following relations.

$$r_2 = r_a/M \quad (1)$$

$$r_3 = r_b/M \quad (2)$$

As so arranged, most of diffracted light, which passed through the annular transparent portion 5e in the spatial filter 5 on the pupil plane in illumination optical system and passed through a larger pattern on photomask 9, can pass through the spatial filter 12 on the pupil plane of projection optical system. As an alternative, values of diameters $r_2$, $r_3$ may be intentionally deviated from the values obtained from the relations of Equations (1) and (2), thereby to decrease diffracted light passing through the above larger pattern, whereby the ratio of light quantity may be controlled between an image of a large hole pattern and an image of a small hole pattern on wafer 13.

The spatial filters 5, 12 provided in the illumination optical system and in the projection optical system may be formed by patterning of metal film or the like on a transparent substrate, or by punching the transparent portion(s) through a thin plate of metal or the like.

Figure 11:
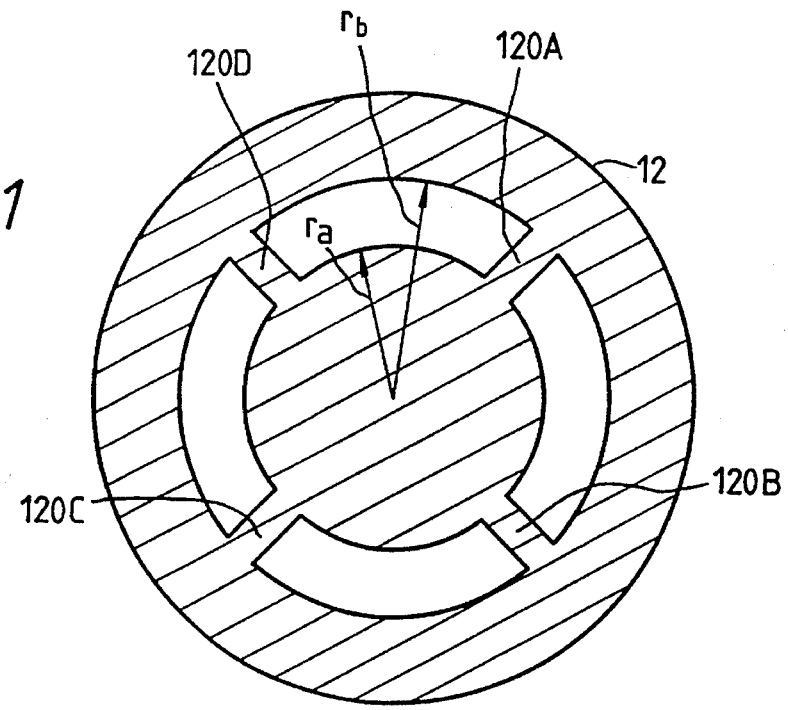
FIG. 11 and FIG. 12 are plan views to show modifications of a spatial filter suitable for the embodiment of the present invention.

FIG. 11 shows a modification of the spatial filter 12. As shown in FIG. 11, light shielding portions 120A, 120B, 120C, 120D are provided in the annular transparent portion of inner radius $r_a$ and outer radius $r_b$ without influence on the effect of the present invention. Employing the structure shown in FIG. 11, the spatial filter may be easily made by punching the transparent portion through a thin plate such as metal.

Figure 12:
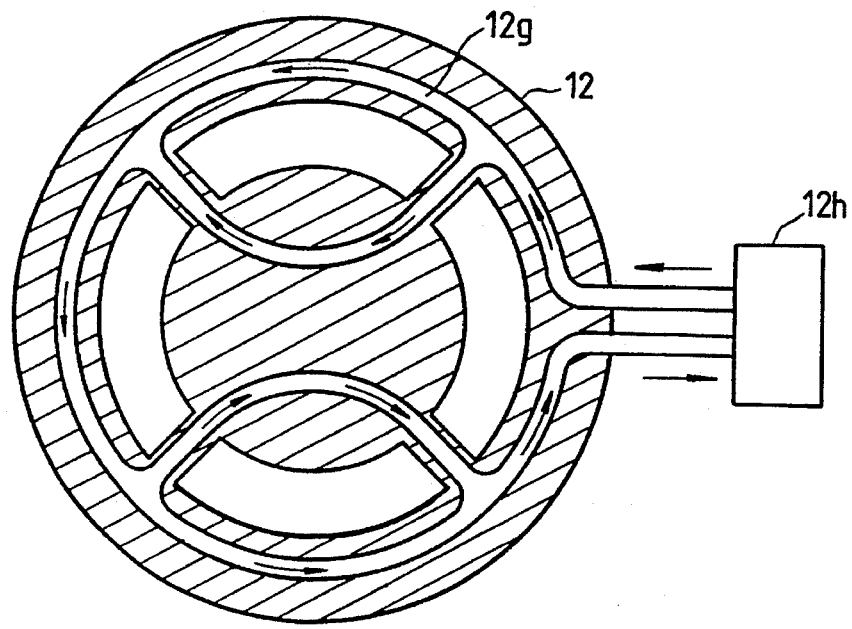

FIG. 12 shows an example in which a cooling arrangement is provided for the spatial filter shown in FIG. 11. A cooling device 12h supplies a cooling fluid (gas or liquid), which cools the shielding portion in the spatial filter through a cooling pipe 12g. The entire cooling pipe 12g is attached only to the shielding portion in spatial filter 12, thus causing no influence on the transparent portion. The cooling pipe 12g so arranged is preferably provided on a plane on the reverse side (wafer side) opposite to the light irradiation side (light source side) of spatial filter 12.

By cooling or temperature-controlling the spatial filter 12 or the spatial filter 5 by the cooling member, the spatial filter 12 (or 5) may be prevented from increasing its temperature due to absorption of light. Thus, a temperature rise may be avoided in members in projection optical system, which could be seen with the temperature rise of spatial filter. Therefore, the above arrangement can prevent a deviation in focal point, magnification, distortion, etc. arising from temperature rise. The cooling medium may be a flow of temperature-controlled gas onto the spatial filter 12.

Although the present embodiment employs the spatial filter 5 as an optical member for producing the above-described light quantity distribution in the vicinity of the pupil plane of the illumination optical system, another member may be used in place of it. For example, the focal length of elliptic mirror 2 may be arranged to vary from the central portion to the peripheral portion such that reflection beams from the center are focused within radius $r_1$ but reflection beams from the periphery are focused on the annular zone between the radii $r_2$ and $r_3$. In another arrangement, a concentric ND filter may be separately provided between the light source 1 and the filter 5 to change the distribution of illumination beams reaching the filter 5 in the radial direction of filter 5. The mercury lamp as light source may be replaced by an emission line lamp or a laser source.

The spatial filter 5 shown in FIG. 2 is used in the present embodiment, while in another example no light shielding portion (or no light reducing portion) may be provided between the circular transparent portion 5c and the annular transparent portion 5e for example by setting as $r_1 = r_2$. In other words, the illumination light may be arranged to pass through the entire circular region of radius $r_3$ ($<r_1$) with the center on the optical axis on the pupil plane (Fourier transform plane) of the illumination optical system, and the light quantity distribution of the illumination light may be set in the circular region of radius $r_3$ such that a light quantity of illumination light passing through a circular region of radius $r_1$ with the center on optical axis is approximately twice or more times a light quantity of illumination light passing through an annular zone between a radius $r_1$ ($=r_2$) and radius $r_3$ with center on the optical axis. This is fulfilled for example by locating on the pupil plane of the illumination optical system or on a plane near the pupil plane a spatial filter having a circular aperture of radius $r_1$ and an annular light reducing member (ND filter) surrounding the circular aperture and ranging from radius $r_1$ ($=r_2$) to radius $r_3$. In this arrangement, the radius $r_1$ of circular transparent portion (inner radius $r_2$ of annular transparent portion) and the outer radius $r_3$ of annular transparent portion on the pupil plane of illumination optical system may be preferably set approximately to values determined by the relations of $r_1=r_2=r_a/M$ and $r_3=r_b/M$. Using such spatial filter, a loss of light quantity is advantageously reduced as compared with the arrangement using the spatial filter shown in FIG. 2.

Incidentally, if a reticle is formed only with fine hole pattern, the consideration of the linearity as described before becomes unnecessary, which in turn necessitates no consideration on the ratio of light quantity of illumination light passing through the pupil plane of the illumination optical system. The light quantity may be determined as set in the conventional procedure.

The focal depth may be further increased by employing in the exposure apparatus shown in the embodiments the exposure method in which the wafer is moved along the optical axis during exposure between a plurality of locations or the exposure method in which a wafer is continuously moved along the optical axis. In this arrangement, the image plane of the projection optical system may be moved along the optical axis relative to the wafer by moving the reticle or by adjusting the imaging properties of projection optical system.

In case that the wafer is moved or vibrated during exposure as described, the optimum moving amount will change depending upon the exposure wavelength $\lambda$ and the numerical aperture (NA) of projection optical system or upon the radii $r_a$, $r_b$ of spatial filter 12. This is because an amount of wavefront aberration (out-of-focus amount) for certain defocus varies depending upon these values. The wavefront aberration $\Delta W$ by defocus is as follows in the conventional optical system.

$$\Delta W = -\Delta F\{\sqrt{(1-NA^2)} - 1\} \approx \Delta F \cdot NA^2/2$$

(where $\Delta F$ is a defocus amount).

However, an amount of wavefront aberration $\Delta W'$ is as follows in the present invention because the central portion of pupil plane of the projection optical system (the region with small NA) is shielded.

$$\Delta W' = \Delta F\{\sqrt{(1-r_{b2})} - \sqrt{(1-r_a^2)}\}$$

In the above equation, ra and rb are values converted into numerical apertures on the wafer side from the inner radius and the outer radius of the annular transparent portion on pupil plane.

From values of wavefront aberration by defocus, experiment results and simulation results, the above movement amount in the conventional exposure apparatus may be set for movement between discrete positions (predetermined movement increment) as a distance between the positions is about $\Delta F_0$ making $\Delta W$ equal to about $0.85 \times \lambda$. Namely, $$-\Delta F_0\{\sqrt{(1-NA^2)} - 1\} = \Delta W = 0.85\lambda.$$

From the above equation, the distance is preferably the following $\Delta F_0$.

$$\Delta F_0 = 0.85\lambda/\{1 - \sqrt{(1-NA^2)}\}$$

In contrast, the present invention shows different wavefront aberration from $\Delta W$ in the conventional method, and the following relation is set with the same numerical aperture NA and exposure wavelength $\lambda$ (setting as $r_b=NA$).

$$-\Delta F_1\{\sqrt{(1-NA^2)} - \sqrt{(1-r_a^2)}\} = \Delta W' = 0.85\lambda$$

From the above equation, the optimum movement amount is defined as follows.

$$\Delta F_1 = 0.85\lambda/\{\sqrt{(1-r_a^2)} - \sqrt{(1-NA^2)}\}$$

The above amount may be approximated as follows by the Taylor expansion.

$$\Delta F_1 \approx 0.85\lambda/(\sqrt{r_a^2/2} - \sqrt{NA^2/2})$$

If the movement is continuous during exposure and the moving speed is approximately constant during movement, the total amount of movement during exposure may be preferably set to approximately twice or more times the above $\Delta F_1$.

Regarding the radii $r_a$ and $r_b$ in the present invention, it was already described that $r_a$ was preferably about 0.5–0.8 times of $r_b$ and that the effect of improvement in focal depth was reduced with ra of not more than 0.5. However, if the apparatus according to the present invention is combined with the movement of wafer during exposure as described above, the depth of focus is further increased by the movement of wafer during exposure. Therefore, a sufficient focal depth can be obtained even with $r_a$ being about 0.3–0.5 times of $r_b$. However, $r_a$ smaller than 0.3 times of $r_b$ is not so preferable because the profile of hole pattern image is degraded (unfocused).

The present invention may be applied not only in steppers of step-and-repeat method but also in those of step scan method provided with a real size or reduction projection system in which the mask and the wafer are relatively scanned to the projection system. For alignment between the mask 9 and the wafer 13, an alignment mark on wafer 13 must be detected through the projection optical system. There are various methods to detect a mark on wafer 13. One of practical methods uses a laser light or a lamp radiative light of wavelength different from the illumination light for exposure. Such mark detection system is called an alignment sensor, in which if the mark detection is carried out with illumination light of wavelength different from that for exposure, the illumination light for alignment or detection light from wafer mark could be shielded (or reduced) depending upon the shape of the transparent portion in spatial filter 12 provided on the pupil plane of projection lens 11. Then, the filter 12 on the pupil plane of projection lens 11 may be formed as follows. A sharp-cut filter is made by vapor-depositing a thin film (dielectric multilayer) on a glass (quartz) plate in a desired shape of shielding portion such that the wavelength (short wavelength) of the illumination light for exposure is cut, but the wavelength (long wavelength) of the illumination light or the detection light for alignment can be transmitted at a high transmittance over the entire area. This arrangement can enjoy the advantage that the conventional optical design may be used for an alignment sensor of different wavelength.

What is claimed is:

1. A projection exposure apparatus comprising:
   an illumination optical system for irradiating a mask with illumination light;
   a projection optical system for projecting an image of a pattern formed on said mask onto a substrate;
   an optical member for defining a light quantity distribution of said illumination light on or near a Fourier transform plane to the pattern on said mask in said illumination optical system such that the illumination light is intensified in a first region inside a substantial circle of radius $r_1$ with a center on an optical axis of said illumination optical system and in a substantially annular second region bordered by a substantial circle of radius $r_2$ and a substantial circle of radius $r_3$ (where $r_1 \leq r_2 < r_3$) with respective centers thereof on said optical axis, and such that a light quantity in said first region is made approximately twice or more times a light quantity in said second region; and
   a spatial filter having an annular transparent portion and disposed on or near a Fourier transform plane to the pattern on said mask in said projection optical system.

2. A projection exposure apparatus according to claim 1, wherein the Fourier transform plane in said illumination optical system is in an image forming relation with the Fourier transform plane in said projection optical system and wherein if an imaging magnification is M and if an inner radius and an outer radius of the annular transparent portion of said spatial filter are $r_a$ and $r_b$, respectively, the radii $r_2$ and $r_3$ of said second region are determined by the relations $r_2 = r_a/M$ and $r_3 = r_b/M$.

3. A projection exposure apparatus according to claim 1, wherein said spatial filter is arranged such that an inner radius of said annular transparent portion is from about 0.5 to about 0.8 times an outer radius thereof.

4. A projection exposure apparatus according to claim 1, further comprising means for supplying a temperature-controlled fluid to said spatial filter in order to cool said spatial filter.

5. A projection exposure apparatus according to claim 1, further comprising means for relatively moving an imaging plane of said projection optical system and said substrate along an optical axis of said projection optical system during exposure of said substrate with the pattern of said mask.

6. A projection exposure apparatus according to claim 5, wherein said relatively moving means moves said substrate along the optical axis at least once and wherein if a wavelength of said illumination light is $\lambda$, if a numerical aperture of said projection optical system is NA, and if an inner radius of the annular transparent portion of said spatial filter is $r_a$, an amount of each movement of said substrate is set to approximately $0.85\lambda/\{\sqrt{1-r_a^2}-\sqrt{1-NA^2}\}$.

7. A projection exposure apparatus according to claim 5, wherein said relatively moving means moves said substrate continuously along the optical axis and wherein if a wavelength of said illumination light is $\lambda$, if a numerical aperture of said projection optical system is NA, and if an inner radius of the annular transparent portion of said spatial filter is $r_a$, an amount of movement of said substrate during exposure is set to a value of approximately twice or more times $$0.85\lambda/\{\sqrt{(1-r_a^2)} - \sqrt{(1-NA^2)}\}.$$

8. A projection exposure apparatus according to claim 5, wherein said spatial filter is arranged such that an inner radius of said annular transparent portion is from about 0.3 to about 0.8 times an outer radius thereof.

9. A projection exposure apparatus comprising:
   an illumination optical system for irradiating a mask with illumination light;
   a projection optical system for projecting an image of a pattern formed on said mask onto a substrate;
   means for relatively moving said substrate and an imaging plane of said projection optical system along an optical axis of said projection optical system during exposure of said substrate with the pattern on said mask; and
   a spatial filter having an annular transparent portion and disposed on or near a Fourier transform plane to the pattern on said mask in said projection optical system, wherein a ratio of an inner radius to an outer radius of said annular transparent portion is set from about 0.3 to about 0.8.

10. A projection exposure apparatus comprising:
    an illumination optical system for irradiating a mask with illumination light;
    a projection optical system for projecting an image of a pattern formed on said mask onto a substrate;
    a spatial filter having an annular transparent portion and disposed on or near a Fourier transform plane to the pattern on said mask in said projection optical system; and
    means for relatively moving an imaging plane of said projection optical system and said substrate along an optical axis of said projection optical system during exposure of said substrate with the pattern on said mask;
    wherein said relatively moving means moves said imaging plane and said substrate by a distance not less than approximately $0.85\lambda/\{\sqrt{(1-r_a^2)}-\sqrt{(1-NA^2)}\}$, where $\lambda$ is a wavelength of said illumination light, NA is a numerical aperture of said projection optical system, and $r_a$ is an inner radius of said annular transparent portion.

11. A projection exposure apparatus comprising:
    a light source;
    an illumination optical system for irradiating a mask with a light beam from said light source, said illumination optical system forming a light intensity distribution of said light beam in a substantially annular region with a center on an optical axis on or near a Fourier transform plane to a pattern surface on said mask in said illumination optical system, and making a light intensity of an area surrounded by said annular region different from a light intensity of said annular region;
    a projection optical system for projecting an image of a pattern of said mask onto a substrate; and
    an optical filter having a substantially circular light shielding portion and disposed on or near a Fourier transform plane to the pattern surface on said mask in said projection optical system.

12. An apparatus according to claim 11, wherein said illumination optical system includes an optical filter having a substantially annular transparent portion and disposed on or near said Fourier transform plane in said illumination optical system.

13. An apparatus according to claim 11, further comprising:
a moving device for relatively moving an imaging plane of said projection optical system and said substrate in a direction of an optical axis of said projection optical system during exposure of said substrate with the pattern of said mask.

14. An apparatus according to claim 13, wherein said moving device includes a stage which is moveable in the direction of said optical axis while holding said substrate.

15. A projection exposure apparatus comprising:
a projection optical system for projecting an image of a pattern formed on a mask onto a substrate;
a moving device for relatively moving an imaging plane of said projection optical system and said substrate along an optical axis of said projection optical system during exposure of said substrate with the pattern on said mask; and
an optical filter having a substantially circular light shielding portion and disposed on or near a Fourier transform plane to a pattern surface on said mask in said projection optical system, wherein a ratio of a radius of said circular light shielding portion to a radius of an effective pupil plane of said projection optical system ranges from about 0.3 to about 0.8.

16. A projection exposure apparatus comprising:
an illumination optical system for irradiating a mask with a light beam;
a projection optical system for projecting an image of a pattern formed on said mask onto a substrate;
an optical filter having a substantially circular light shielding portion and disposed on or near a Fourier transform plane to a pattern surface on said mask in said projection optical system; and
a moving device for relatively moving an imaging plane of said projection optical system and said substrate along an optical axis of said projection optical system during exposure of said substrate with the pattern on said mask, wherein said moving device relatively moves said imaging plane and said substrate with a predetermined movement increment set at approximately $$0.85\lambda / \{\sqrt{(1-r_a^2)} - \sqrt{(1-NA^2)}\}$$

where
$\lambda$ denotes a wavelength of said light beam,
NA denotes a numerical aperture of said projection optical system, and
$r_a$ denotes a radius of said substantially circular light shielding portion.

17. An apparatus according to claim 16, wherein said moving device includes a stage which is moveable along said optical axis while holding said substrate, said stage having a predetermined movement increment set at approximately $$0.85\lambda / \{\sqrt{(1-r_a^2)} - \sqrt{(1-NA^2)}\}.$$

18. A projection exposure apparatus comprising:
an illumination optical system for irradiating a mask with a light beam;
a projection optical system for projecting an image of a pattern formed on said mask onto a substrate;
an optical filter having a substantially circular light shielding portion and disposed on or near a Fourier transform plane to a pattern surface on said mask in said projection optical system; and
a moving device for relatively moving an imaging plane of said projection optical system and said substrate along an optical axis of said projection optical system during exposure of said substrate with the pattern on said mask, wherein said moving device moves said imaging plane and said substrate continuously and a length of travel of said imaging plane and said substrate along said optical axis is set at a value not less than approximately twice $$0.85\lambda / \{\sqrt{(1-r_a^2)} - \sqrt{(1-NA^2)}\}$$

where
$\lambda$ denotes a wavelength of said light beam,
NA denotes a numerical aperture of said projection optical system, and
$r_a$ denotes a radius of said substantially circular light shielding portion.

19. An apparatus according to claim 18, wherein said moving device includes a stage which is moveable along said optical axis while holding said substrate and a length of travel of said stage along said optical axis is set at a value not less than approximately twice $$0.85\lambda / \{\sqrt{(1-r_a^2)} - \sqrt{(1-NA^2)}\}.$$

20. A method of exposing an image of a pattern formed on a mask onto a substrate through a projection optical system, comprising the steps of:
disposing an aperture member on or near a Fourier transform plane to a pattern surface on said mask in said projection optical system, said aperture member having a substantially circular light shielding portion; and
effecting incremental relative movement of an imaging plane of said projection optical system and said substrate along an optical axis of said projection optical system during exposure of said substrate with the image of said pattern, with a movement increment of approximately $$0.85\lambda / \{\sqrt{(1-r_a^2)} - \sqrt{(1-NA^2)}\}$$

where
$\lambda$ denotes a wavelength of a light beam illuminating said mask,
NA denotes a numerical aperture of said projection optical system, and
$r_a$ denotes a radius of said substantially circular light shielding portion.

21. A method of exposing an image of a pattern formed on a mask onto a substrate through a projection optical system, comprising the steps of:
disposing an aperture member on or near an effective pupil plane of said projection optical system, said aperture member having a substantially circular light shielding portion wherein a ratio of a radius of said circular light shielding portion to a radius of the pupil plane ranges from about 0.3 to about 0.8; and moving relatively an imaging plane of said projection optical system and said substrate along an optical axis of said projection optical system during exposure of said substrate with the image of said pattern.

22. A method of exposing an image of a pattern formed on a mask onto a substrate through a projection optical system, comprising the steps of:

disposing an aperture member on or near a Fourier transform plane to a pattern surface on said mask in said projection optical system, said aperture member having a substantially circular light shielding portion; and effecting continuous relative movement of an imaging plane of said projection optical system and said substrate along an optical axis of said projection optical system during exposure of said substrate with the image of said pattern, with a movement amount not less than approximately twice $$0.85\lambda/\{\sqrt{(1-r_a^2)} - \sqrt{(1-NA^2)}\}$$

where $\lambda$ denotes a wavelength of said light beam,

NA denotes a numerical aperture of said projection optical system, and $r_a$ denotes a radius of said substantially circular light shielding portion.

* * * * *